United States Patent
Huang et al.

(10) Patent No.: US 9,048,186 B2
(45) Date of Patent: Jun. 2, 2015

(54) METHODS FOR FORMING INTEGRATED CIRCUITS

(75) Inventors: Kuo Bin Huang, Jhubei (TW); Hsin-Chien Lu, Tucheng (TW); Ryan Chia-Jen Chen, Chiayi (TW); Chi-Ming Yang, Hsian-San District (TW); Chyi Shyuan Chern, Taipei (TW); Chin-Hsiang Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 12/879,371

(22) Filed: Sep. 10, 2010

(65) Prior Publication Data

US 2011/0086504 A1    Apr. 14, 2011

Related U.S. Application Data

(60) Provisional application No. 61/249,749, filed on Oct. 8, 2009.

(51) Int. Cl.
*H01L 21/3205* (2006.01)
*H01L 21/28* (2006.01)
*H01L 21/02* (2006.01)
*H01L 21/8238* (2006.01)

(52) U.S. Cl.
CPC .... *H01L 21/28238* (2013.01); *H01L 21/02071* (2013.01); *H01L 21/823842* (2013.01); *H01L 21/823857* (2013.01)

(58) Field of Classification Search
CPC .............. H01L 21/02071; H01L 21/823842; H01L 21/823857; H01L 21/28238
USPC ............... 438/591, 974, 240; 257/E21.587
See application file for complete search history.

(56) References Cited

U.S. PATENT DOCUMENTS

| | | | |
|---|---|---|---|
| 7,166,505 B2 * | 1/2007 | Chau et al. | 438/240 |
| 2007/0178637 A1 * | 8/2007 | Jung et al. | 438/216 |
| 2008/0076268 A1 * | 3/2008 | Kraus et al. | 438/785 |
| 2009/0294920 A1 * | 12/2009 | Chudzik et al. | 257/632 |

OTHER PUBLICATIONS

OA dated Mar. 29, 2012 from corresponding application No. CN 201010501839.5.

* cited by examiner

*Primary Examiner* — Shaun Campbell
(74) *Attorney, Agent, or Firm* — Lowe Hauptman & Ham, LLP

(57) ABSTRACT

A method for forming an integrated circuit is provided. The method includes forming a gate dielectric structure over a substrate. A titanium-containing sacrificial layer is formed, contacting the gate dielectric structure. The whole titanium-containing sacrificial layer is substantially removed.

16 Claims, 8 Drawing Sheets

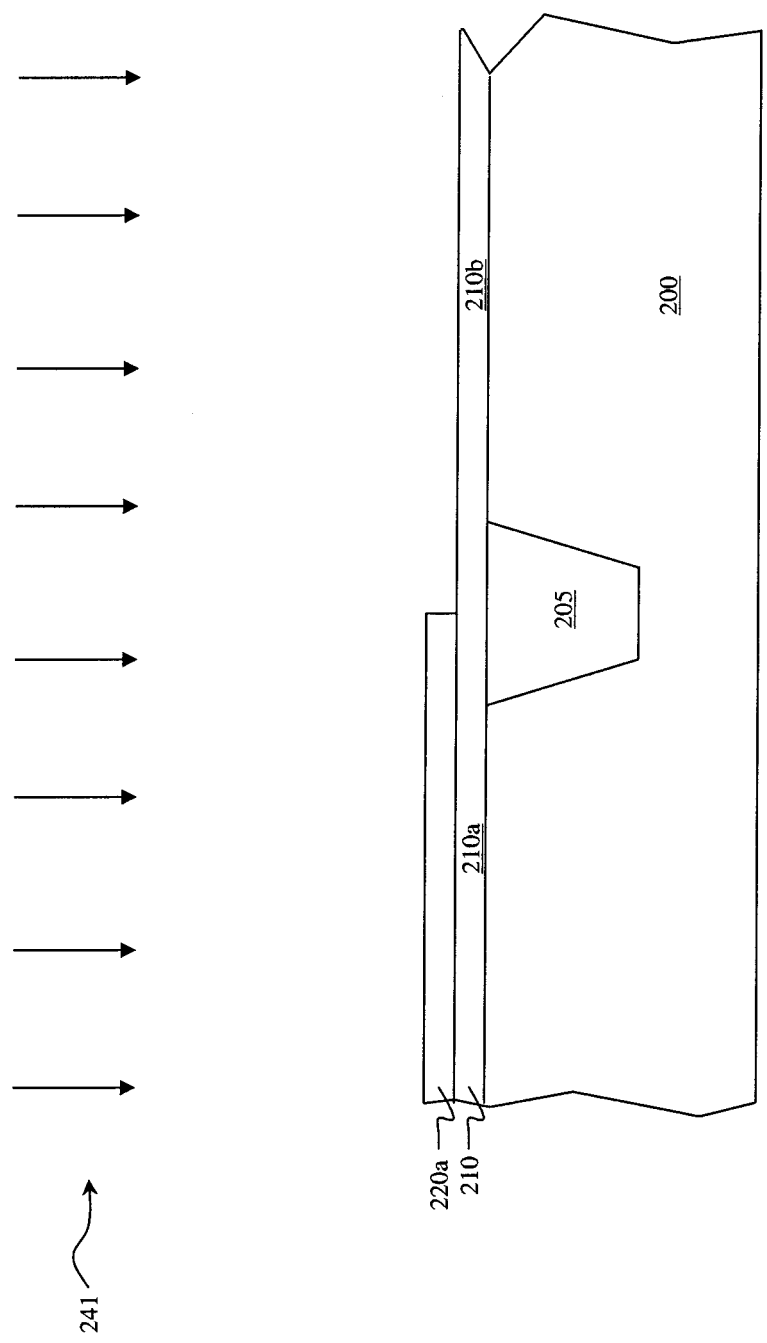

METHODS FOR FORMING INTEGRATED CIRCUITS

CROSS-REFERENCE TO RELATED APPLICATIONS

The present application claims priority of U.S. Provisional Patent Application Ser. No. 61/249,749, filed on Oct. 8, 2009, which is incorporated herein by reference in its entirety.

TECHNICAL FIELD

The present disclosure relates generally to the field of semiconductor circuits, and more particularly, to methods for forming integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIGS. 2A-2G are schematic cross-sectional views illustrating an exemplary method for forming an integrated circuit.

DETAILED DESCRIPTION

Figure 1:
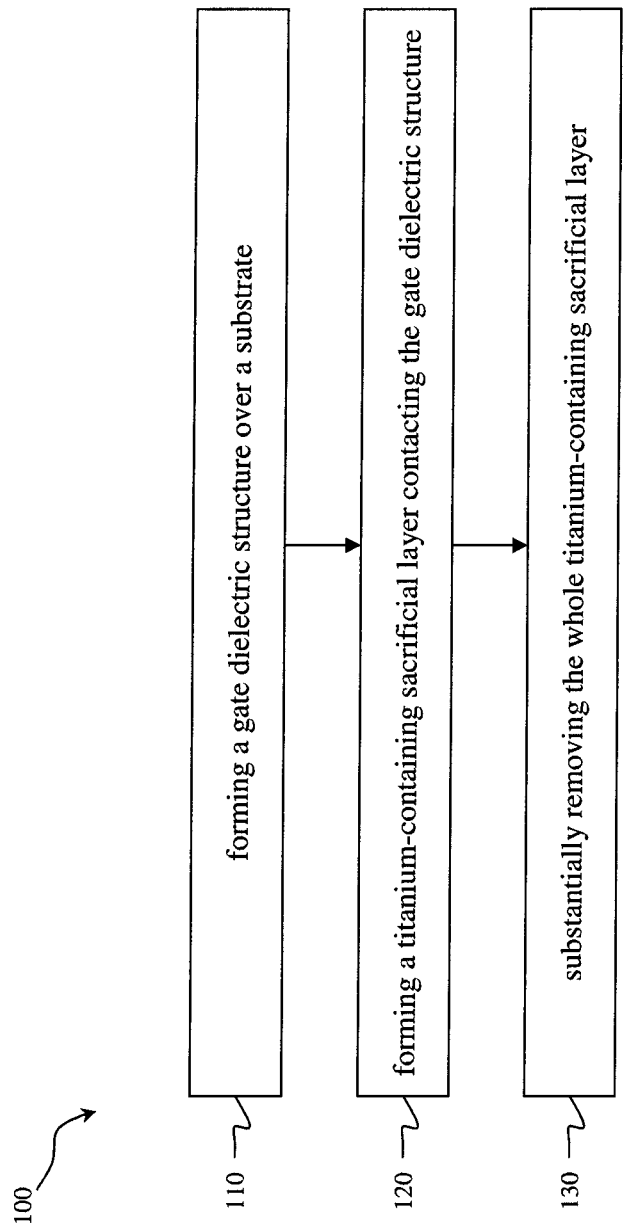
FIG. 1 is a flowchart illustrating a method for cleaning organic residues disposed over a gate dielectric structure.

Conventionally, techniques for forming the metal gate electrode can be cataloged as gate-first processes and gate-last processes. For a conventional gate-first process, a high-k gate dielectric layer is formed over a substrate. A capping layer is formed over the high-k gate dielectric layer. A photoresist (PR) layer is defined over the capping layer for patterning the capping layer. After patterning the capping layer, the PR layer is removed. Following the removal of the PR layer, a titanium nitride (TiN) gate electrode is formed, directly contacting the high-k gate dielectric layer and the capping layer. A polysilicon layer is formed directly on the TiN gate electrode.

As noted, after patterning the capping layer, the PR layer is removed. It is found that after the PR removal carbon-containing organic residues are prong to residing on the capping layer and the high-k gate dielectric layer. The carbon-containing organic residues may interact with titanium components of the TiN gate electrode that directly contacts the high-k gate dielectric layer. The interaction results in TiC-like residuals between the high-k gate dielectric layer and the TiN gate electrode. As noted, the polysilicon layer is formed directly on the TiN gate electrode. The deposition of the polysilicon layer can enhance the effect of the TiC-like residuals, resulting in polysilicon humps on the top surface of the polysilicon layer. The polysilicon humps will adversely affect manufacturing processes following the formation of the polysilicon layer.

Based on the foregoing, methods for cleaning the carbon-containing organic residues on the high-k gate dielectric layer and methods for forming integrated circuits are desired.

It is understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flowchart illustrating a method for cleaning organic residues disposed over a gate dielectric structure. In FIG. 1, a method 100 can include forming a gate dielectric structure over a substrate (process 110), forming a titanium-containing sacrificial layer contacting the gate dielectric structure (process 120), and substantially removing the whole titanium-containing sacrificial layer (process 130).

In some embodiments, the gate dielectric structure can include a high-k gate dielectric layer. At least one carbon-containing organic residue can reside on the high-k gate dielectric layer. The carbon-containing organic residues can be residues generated by removing a photoresist layer (PR) from the high-k gate dielectric layer.

To remove the carbon-containing organic residues, the process 120 can form the titanium-containing sacrificial layer that can directly contact the carbon-containing organic residues. A titanium component of the titanium-containing sacrificial layer is capable of interacting with the carbon-containing organic residues to form a product, e.g., TiC-like and/or TiOC-like, product.

After the formation of the TiC-like and/or TiOC-like product, the process 130 can substantially remove the whole titanium-containing sacrificial layer. The process 130 can substantially remove the carbon-containing organic residues that do not interact with the titanium-containing sacrificial layer. The process 130 can also substantially remove the TiC-like product and/or TiOC-like product. By using the processes 120 and 130, the number of the carbon-containing organic residues can be desirably reduced.

Table 1 shows a comparison of poly hump defect counts of conventional gate-first process and an exemplary gate-first process including the method 100 described above in conjunction with FIG. 1.

TABLE 1

| | Conventional gate-first process | Exemplary gate-first process including the cleaning process 100 |
|---|---|---|
| Poly hump defect counts | ~11,500 | ~3,000 |

As noted, the conventional gate-first process does not remove the carbon-containing organic residues residing on the high-k dielectric layer. In contrary to the conventional gate-first process, the method 100 uses the titanium-containing sacrificial layer to interact with the carbon-containing organic residues. Then, the whole titanium-containing sacrificial layer, the non-interacted carbon-containing organic residues, and/or the product can be substantially removed. After the removal process, a metallic gate electrode can be formed over the high-k gate dielectric layer. A polysilicon layer can be formed over the metallic gate electrode. The number of the poly hump defects on the surface of the polysilicon layer can be desirably reduced.

FIGS. 2A-2G are schematic cross-sectional views illustrating an exemplary method for forming an integrated circuit. The exemplary method can include the method 100 for substantially removing carbon-containing organic residues as described above in conjunction with FIG. 1. It is noted that the method shown in FIGS. 2A-2G is an exemplary gate-first process. In other embodiments, the method 100 for substantially removing carbon-containing organic residues can be used in a gate-last process.

Figure 2A:
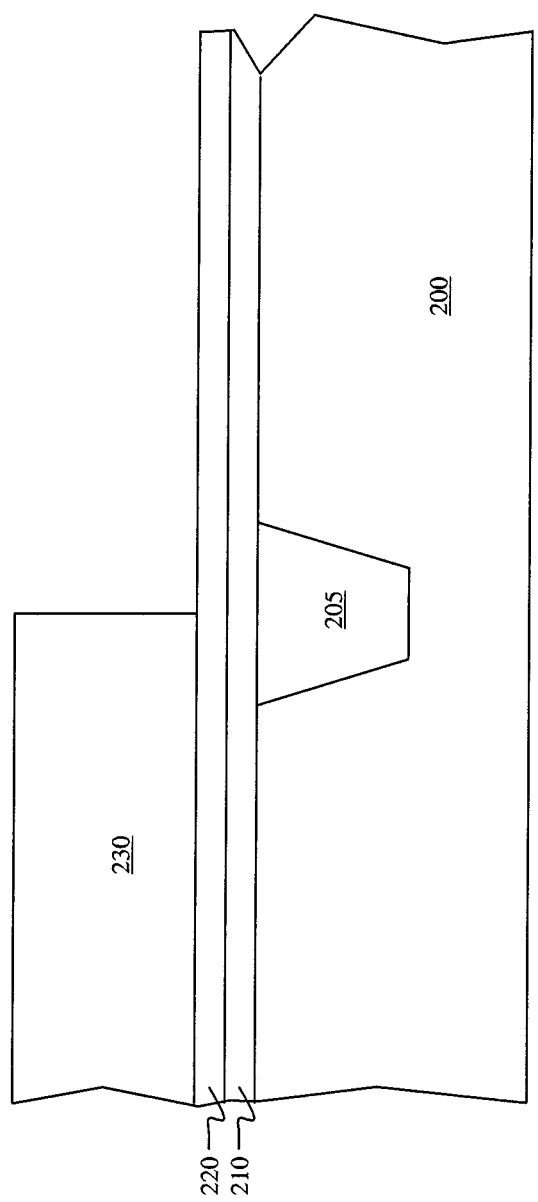

Referring to FIG. 2A, at least one isolation structure, e.g., an isolation structure 205, can be formed within a substrate 200. A gate dielectric structure 210 can be formed over the substrate 200. A capping layer 220 can be formed over the gate dielectric structure 210. A patterned PR layer 230 can be formed over the capping layer by, for example, a photolithographic process.

In some embodiments, the substrate 200 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The isolation structure 205 can be formed in the substrate 200 for isolating a device from other device (not shown). The isolation structure 205 can include a structure of a local oxidation of silicon (LOCOS), a shallow trench isolation (STI) structure, and/or any suitable isolation structure. The isolation structure 205 can be formed by, for example, a STI process, a LOCOS process, and/or other suitable method for forming isolation structures. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

In some embodiments, well regions (not shown) can be formed within the substrate 200. The well regions can be formed by any suitable process, such as ion implantation and/or a rapid thermal process (RTP) to activate the doped regions.

In some embodiments, the gate dielectric structure 210 can be a single layer or a multi-layer structure. In some embodiments for multi-layer structures, the gate dielectric structure 210 can include an interfacial layer and a high-k gate dielectric layer. The interfacial layer can include dielectric material such as, silicon oxide, silicon nitride, silicon oxinitride, other dielectric material, and/or the combinations thereof. The high-k gate dielectric layer can include high-k dielectric materials such as $HfO_2$, HfSiO, HfSiON, HfTaO, HfSiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The gate dielectric structure 210 may be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

In some embodiments, the capping layer 220 can include a p-type work function metallic material, an n-type work function metallic material, and/or combinations thereof. In embodiments using a p-type work function metallic material, the capping layer 220 can include materials such as metal, metal carbide, metal nitride, or other materials that can provide a desired work function for transistors. In some embodiments, the p-type work function metallic material can include a material such as ruthenium, palladium, platinum, cobalt, nickel, and conductive metal oxides, e.g., ruthenium oxide, other p-type metallic material that is capable of modulating the work function value of the gate electrode of a PMOS transistor, or the combinations thereof. In other embodiments, the p-type work function metallic material can include TiN. The p-type work function metallic material is capable of providing a work function value of about 4.8 eV or more for the gate electrode of the PMOS transistor. The capping layer 220 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2B:
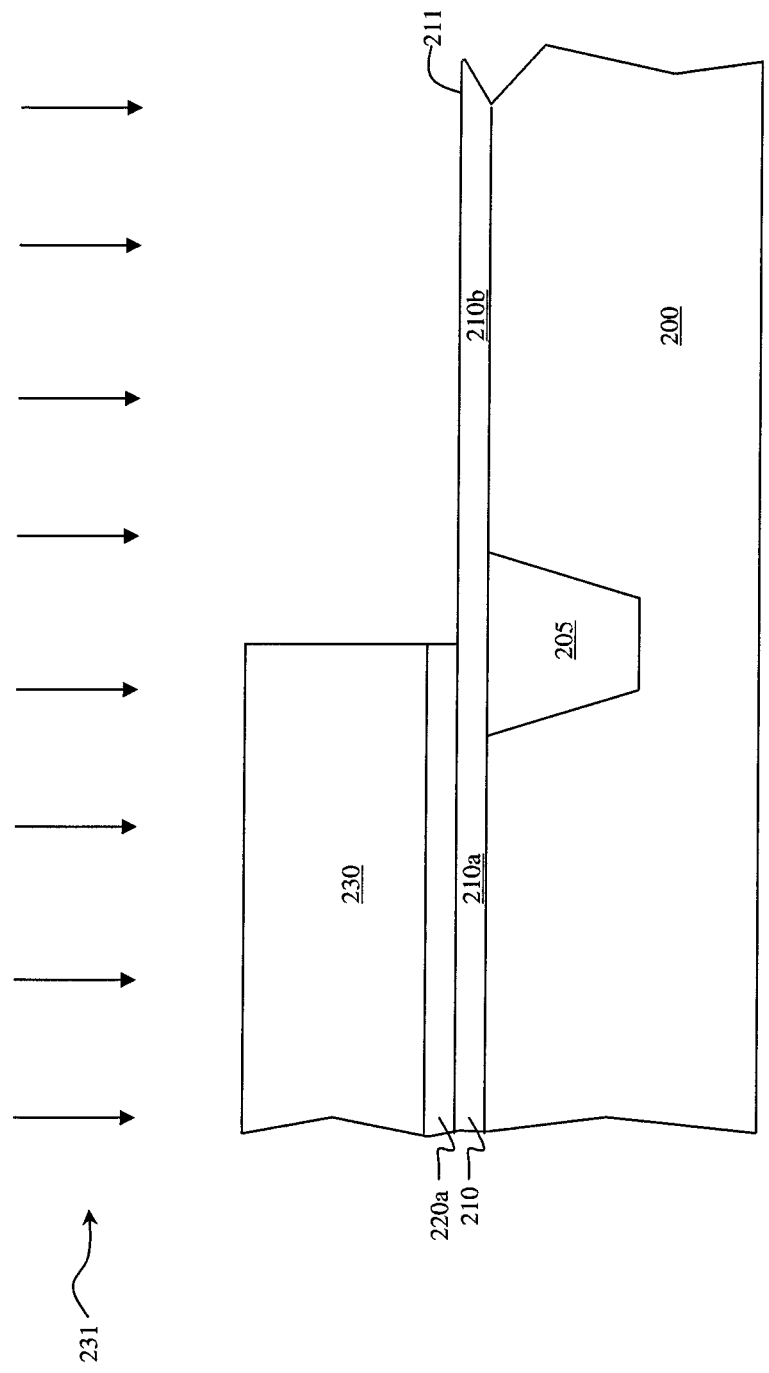

Referring to FIG. 2B, a removing process 231 using the patterned PR layer 230 as a mask removes a portion of the capping layer 220, defining the capping layer 220a. The capping layer 220a can cover a portion 210a of the gate dielectric structure 210 and expose a surface 211 of another portion 210b of the gate dielectric structure 210. The removing process 231 can include a dry etch, a wet etch, or any combinations thereof. In some embodiments, an area including the portion 210a can be used for forming an NMOS transistor. Another area including the portion 210b can be used for forming a PMOS transistor.

Figure 2C:
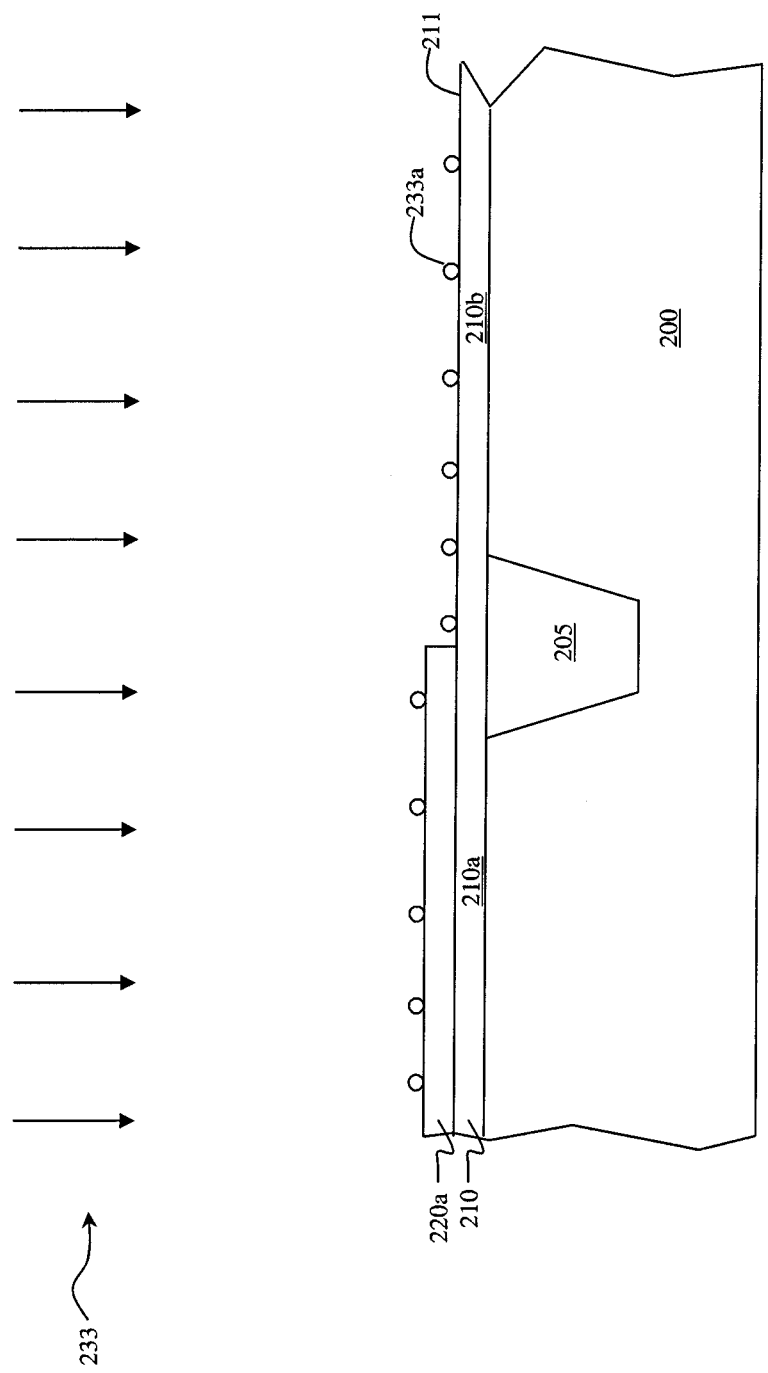

Referring to FIG. 2C, a PR removing process 233 can substantially remove the patterned PR layer 230 (shown in FIG. 2B). In some embodiments, the PR removing process 233 can be referred to as a PR strip process. After the PR layer 230 is removed, it is found that carbon-containing organic residues 233a may reside on the capping layer 220a and/or the portion 210b of the gate dielectric structure 210.

Figure 2D:
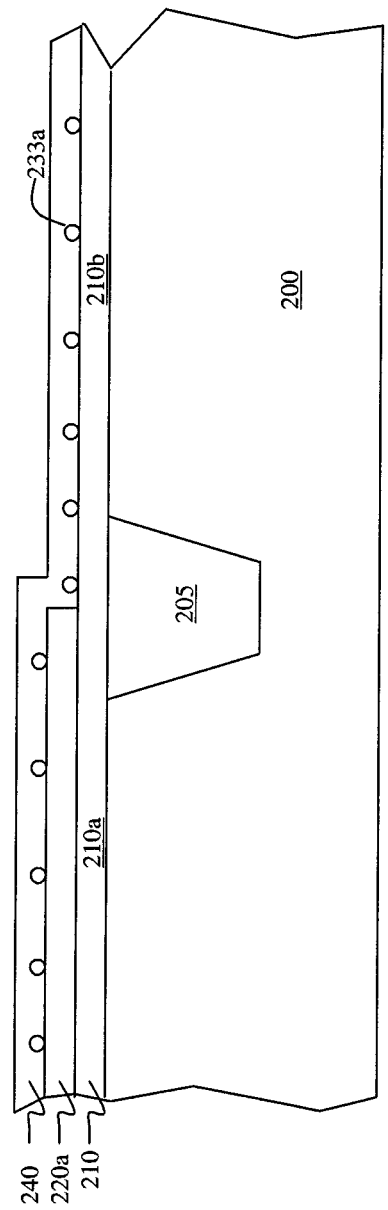

Referring to FIG. 2D, a titanium-containing sacrificial layer 240 can be formed over the capping layer 220a and the gate dielectric structure 210. The titanium-containing sacrificial layer 240 can directly contact the carbon-containing organic residues 233a. A titanium component of the titanium-containing sacrificial layer 240 can interact with the carbon-containing organic residues 233a to form a product, e.g., TiC-like and/or TiOC-like product.

The titanium-containing sacrificial layer 240 can include a material such as titanium nitride (TiN), titanium oxynitride (TiON), titanium oxide ($TiO_2$), titanium monoxide (TiO), titanium carbide (TiC), titanium oxycarbide (TiOC), or any combinations thereof. The titanium-containing sacrificial layer 240 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In some embodiments, the titanium-containing sacrificial layer 240 can have a thickness of about 20 Å or less. In other embodiments, the titanium-containing sacrificial layer 240 can have a thickness between about 15 Å and about 10 Å. In still other embodiments, the titanium-containing sacrificial layer 240 can have a thickness of about 10 Å or a thickness that can provide a desired amount of the titanium component to interact with the carbon-containing organic residues 233a.

Referring to FIG. 2E, a removing process 241 can substantially remove the whole titanium-containing sacrificial layer 240, the carbon-containing organic residues 233a, and/or the TiC-like and/or TiOC-like products. In some embodiments, the removing process 241 can use a solution including a standard clean 1 (SC1) solution, a standard clean 2 (SC2) solution, and/or other solution that can remove the titanium-containing sacrificial layer 240 and be substantially free from damaging the capping layer 220a and/or the gate dielectric structure 210.

Figure 2F:
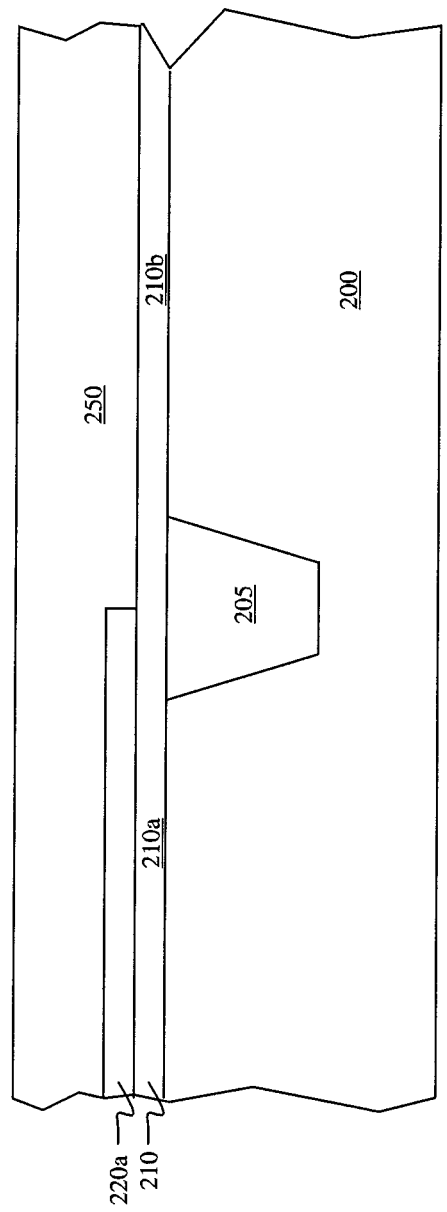

Referring to FIG. 2F, a metallic gate electrode 250 can be formed over the capping layer 220a and the portion 210b of the gate dielectric structure 210. In some embodiments, the metallic gate electrode 250 can include a material such as titanium nitride (TiN), titanium oxynitride (TiON), titanium oxide ($TiO_2$), titanium monoxide (TiO), titanium carbide (TiC), titanium oxycarbide (TiOC), or any combinations thereof. In other embodiments, the metallic gate electrode 250 can have the same material as the titanium-containing sacrificial layer 240. In still other embodiments, the titanium-containing sacrificial layer 240 can include a metallic material including metal compounds such as, Mo, Cu, W, Ti, Ta, TaN, NiSi, CoSi, and/or other suitable conductive materials known in the art. The metallic gate electrode 250 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2G:
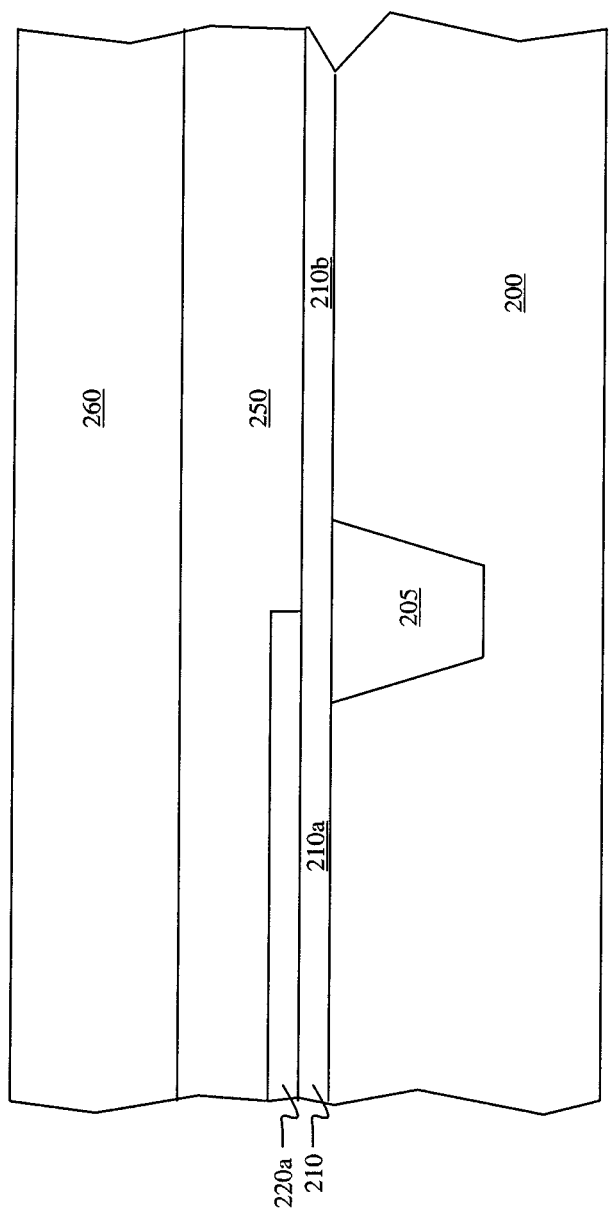

Referring to FIG. 2G, a polysilicon layer 260 can be formed over the metallic gate electrode 250. In some embodiments, the polysilicon layer 260 can be formed by any suitable process, such as atomic layer deposition (ALD), chemical vapor deposition (CVD), physical vapor deposition (PVD), remote plasma CVD (RPCVD), plasma enhanced CVD (PECVD), and/or combinations thereof.

It is noted that the exemplary process for forming integrated circuits may also include patterning the gate dielectric structure 210, the capping layer 220a, the metallic gate electrode 250, and/or the polysilicon layer 260 for defining gates of transistors.

After defining the gates of the transistors, source regions and drain regions (not shown) can be formed adjacent to the gates of the transistors. For embodiments forming an N-type transistor, drain region and the source region can have dopants such as Arsenic (As), Phosphorus (P), other group V element, or any combinations thereof. For embodiments forming a P-type transistor, the drain region and the source region can have dopants such as boron (B), other group III element, or any combinations thereof.

In some embodiments, each of the drain regions and the source regions can include a silicide structure (not shown). The silicide structure may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. In the salicidation process, a deposited metallic material may react with the gate electrode at an elevated temperature that is selected based on the specific material or materials. This is also referred to as annealing, which may include a RTP. The reacted silicide may require a one step RTP or multiple step RTPs.

In some embodiments, dielectric materials, contact plugs, via plugs, metallic regions, and/or metallic lines (not shown) can be formed over the transistors for interconnection. The dielectric layers can include at least one material such as oxide, nitride, oxynitride, low-k dielectric material, ultra-low-k dielectric material, other dielectric material, and/or any combinations thereof. The dielectric layers can be formed by depositing a dielectric material by CVD, ALD, PVD, and/or other suitable processes. The contact plugs, via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The contact plugs, via plugs, metallic regions, and/or metallic lines can be formed by any suitable processes, such as deposition, photolithography, and etching processes, and/or combinations thereof.

It is noted that the method described above in conjunction with FIGS. 2A-2G is merely exemplary. In some embodiments, another capping layer (not shown) can be formed over the capping layer 220a and the portion 210b of the gate dielectric structure 210. Then, the metallic gate electrode 250 is formed over the additional capping layer.

In some embodiments, the additional capping layer can include an n-type work function metallic material. The n-type work function metallic material can include materials such as metal, metal carbide, metal nitride, or other materials that can provide a desired work function for transistors. In some embodiments, the n-type work function metallic material can include materials such as hafnium, zirconium, titanium, tantalum, aluminum, metal carbides, other n-type metallic material that is capable of modulating the work function value of the gate electrode of an N-type transistor, or the combinations thereof. The n-type work function metallic material is capable of providing a work function value of about 4.5 eV or less for the N-type transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit, the method comprising:
    forming a gate dielectric structure over a substrate;
    patterning a metallic capping layer over the gate dielectric structure by using a photoresist layer over the metallic capping layer;
    removing the photoresist layer, thereby leaving carbon-containing organic residues on a patterned metallic capping layer and the gate dielectric structure;
    forming a titanium-containing sacrificial layer over the patterned metallic capping layer and the gate dielectric structure, the titanium-containing sacrificial layer contacting the carbon-containing organic residues;
    generating a product by causing an interaction between the titanium-containing sacrificial layer and the carbon-containing organic residues;
    substantially removing the whole titanium-containing sacrificial layer and the product; and
    patterning the gate dielectric structure after substantially removing the whole titanium-containing sacrificial layer.

2. The method of claim 1, wherein the titanium-containing sacrificial layer has a thickness of about 20 Å or less.

3. The method of claim 1, wherein the titanium-containing sacrificial layer includes titanium nitride (TiN), titanium oxynitride (TiON), titanium oxide (TiO$_2$), titanium monoxide (TiO), titanium carbide (TiC), titanium oxycarbide (TiOC), or any combinations thereof.

4. The method of claim 1, wherein substantially removing the titanium-containing sacrificial layer comprises using a solution including a standard clean 1 (SC1) solution, a standard clean 2 (SC2) solution, or any combinations thereof.

5. The method of claim 1, wherein after substantially removing the titanium-containing sacrificial layer, the method further comprises:
    forming a titanium-containing gate electrode layer over the gate dielectric structure.

6. A method comprising:
    forming the high-k gate dielectric layer over a substrate;
    forming a patterned metallic capping layer using a photoresist layer, wherein carbon-containing organic residues reside on a surface of the patterned metallic capping layer and a surface of the high-k gate dielectric layer, the carbon-containing organic residues resulting from a removal process for removing the photoresist layer;
    forming a titanium-containing sacrificial layer covering the patterned metallic capping layer and the high-k gate dielectric layer, the titanium-containing sacrificial layer contacting the carbon-containing organic residues;
    causing a titanium component of the titanium-containing sacrificial layer to interact with the carbon-containing organic residues to form a product;
    substantially removing the whole titanium-containing sacrificial layer and the product; and
    patterning the high-k gate dielectric layer after substantially removing the whole titanium-containing sacrificial layer.

7. The method of claim 6, wherein the titanium-containing sacrificial layer has a thickness of about 20 Å or less.

8. The method of claim 6, wherein the titanium-containing sacrificial layer includes titanium nitride (TiN), titanium oxynitride (TiON), titanium oxide (TiO$_2$), titanium monoxide (TiO), titanium carbide (TiC), titanium oxycarbide (TiOC), or any combinations thereof.

9. The method of claim 6, wherein substantially removing the titanium-containing sacrificial layer comprises using a solution including a standard clean 1 (SC1) solution, a standard clean 2 (SC2) solution, or any combinations thereof.

10. A method for forming an integrated circuit, the method comprising:
    patterning a metallic capping layer over a high-k gate dielectric layer by a photoresist layer, the metallic capping layer after patterning covering a first portion of the high-k gate dielectric layer and exposing a surface of a second portion of the high-k gate dielectric layer;
    removing the photoresist layer, thereby leaving carbon-containing organic residues on an upper surface of the capping layer and the surface of the second portion of the high-k gate dielectric layer;
    forming a titanium-containing sacrificial layer covering the capping layer and the surface of the second portion of the high-k gate dielectric layer, the titanium-containing sacrificial layer contacting the carbon-containing organic residues;
    generating a product by causing an interaction between the titanium-containing sacrificial layer and the carbon-containing organic residues;
    substantially removing the whole titanium-containing sacrificial layer and the product;
    forming a titanium-containing gate electrode material over the high-k gate dielectric layer; and
    patterning at least the metallic capping layer and the high-k gate dielectric layer after substantially removing the whole titanium-containing sacrificial layer.

11. The method of claim 10, wherein the titanium-containing sacrificial layer has a thickness of about 20 Å or less.

12. The method of claim 10, wherein the titanium-containing sacrificial layer includes titanium nitride (TiN), titanium oxynitride (TiON), titanium oxide (TiO$_2$), titanium monoxide (TiO), titanium carbide (TiC), titanium oxycarbide (TiOC), or any combinations thereof.

13. The method of claim 10, wherein substantially removing the titanium-containing sacrificial layer comprises using a solution including a standard clean 1 (SC1) solution, a standard clean 2 (SC2) solution, or any combinations thereof.

14. The method of claim 10, wherein the titanium-containing gate electrode material has the same material as the titanium-containing sacrificial layer.

15. The method of claim 1, wherein
the causing the interaction comprises causing a titanium component of the titanium-containing sacrificial layer and the carbon-containing organic residues to form the product.

16. The method of claim 10, wherein
the causing the interaction comprises causing a titanium component of the titanium-containing sacrificial layer and the carbon-containing organic residues to form the product.

\* \* \* \* \*